(12) United States Patent
Bozbey et al.

(10) Patent No.: US 12,206,405 B2
(45) Date of Patent: Jan. 21, 2025

(54) SOMA CIRCUIT

(71) Applicant: TOBB EKONOMI VE TEKNOLOJI ÜNIVERSITESI, Ankara (TR)

(72) Inventors: Ali Bozbey, Ankara (TR); Sasan Razmkhah, Ankara (TR)

(*) Notice: Subject to any disclaimer, the term of this patent is extended or adjusted under 35 U.S.C. 154(b) by 0 days.

(21) Appl. No.: 18/550,347

(22) PCT Filed: Mar. 16, 2022

(86) PCT No.: PCT/TR2022/050243
§ 371 (c)(1),
(2) Date: Sep. 13, 2023

(87) PCT Pub. No.: WO2022/197276
PCT Pub. Date: Sep. 22, 2022

(65) Prior Publication Data
US 2024/0305295 A1    Sep. 12, 2024

(30) Foreign Application Priority Data
Mar. 19, 2021   (TR) .......................... TR2021/005089

(51) Int. Cl.
*H03K 17/92* (2006.01)
(52) U.S. Cl.
CPC .................. *H03K 17/92* (2013.01)
(58) Field of Classification Search
CPC .................................................. H03K 17/92

USPC ......................................................... 327/527
See application file for complete search history.

(56) References Cited

U.S. PATENT DOCUMENTS

2019/0050720 A1*   2/2019   Binas ....................... G06N 3/04

FOREIGN PATENT DOCUMENTS

CN              112420841 A       2/2021

OTHER PUBLICATIONS

International Search Report for corresponding PCT/TR2022/050243 dated Jun. 6, 2022.
Written Opinion of the International Searching Authority for corresponding PCT/TR2022/050243 dated Jun. 6, 2022.
Varshavsky et al., "Non-isotonous beta-driven artificial neuron", Proceedings vol. 4055, Applications and Science of Computational Intelligence III; (2000) pp. 251-252, Figure 2.

* cited by examiner

*Primary Examiner* — Tomi Skibinski
(74) *Attorney, Agent, or Firm* — Egbert, McDaniel & Swartz, PLLC

(57) ABSTRACT

Disclosed is a SOMA circuit having a positive input and a negative input, and which ensures that a difference of the current pulses coming from these inputs is taken and a current pulse is transmitted to an output when this difference value exceeds a threshold value.

13 Claims, 1 Drawing Sheet

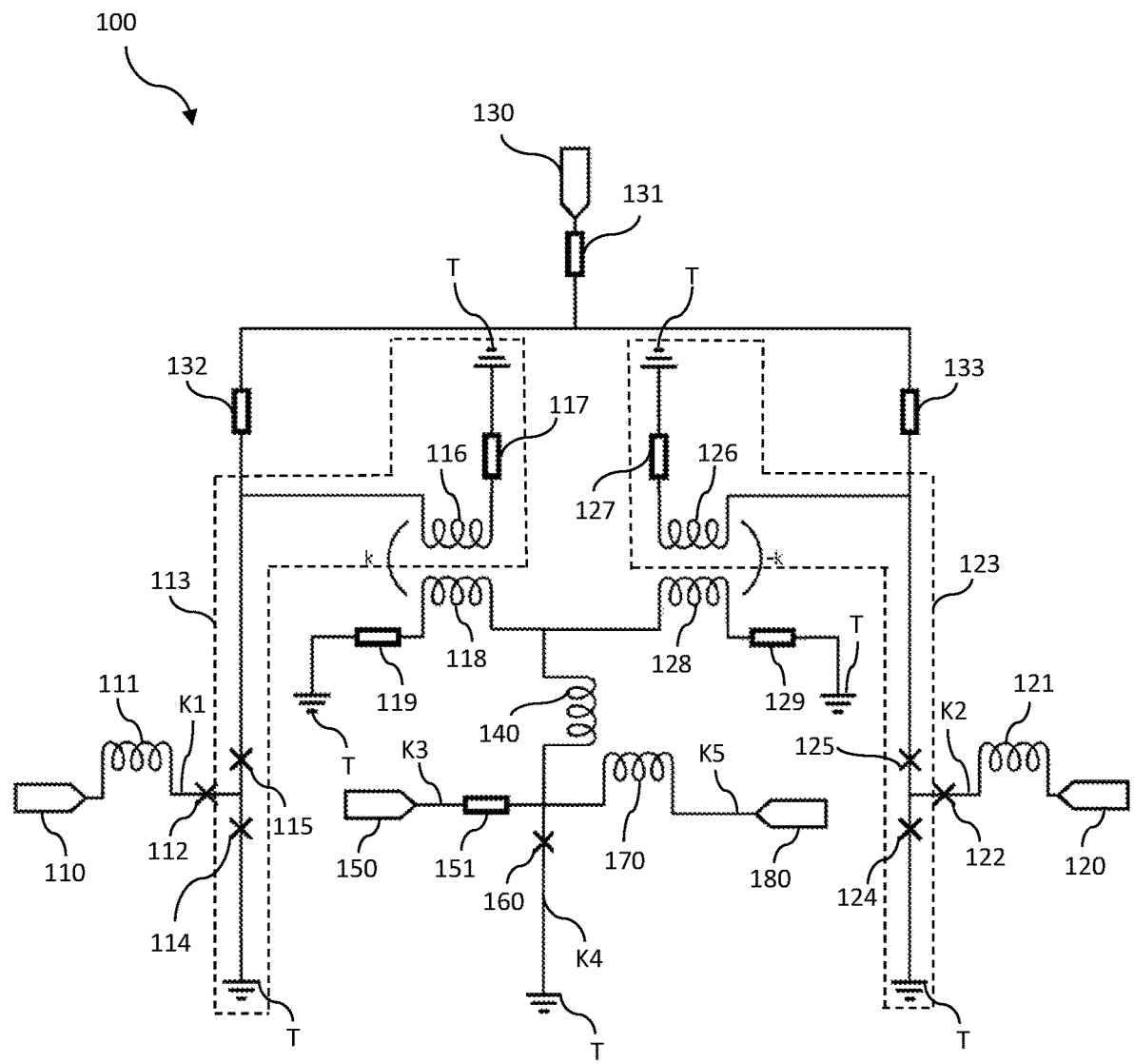

SOMA CIRCUIT

TECHNICAL FIELD

The present invention relates to the development of a single neuron (Soma), which is the basic element of artificial neural networks that can be scaled and more importantly, fabricated and implemented into fast, low-power, complex neural networks.

PRIOR ART

Artificial intelligence is the general name given to the work, wherein, upon getting inspired by the behavioral patterns of all the living creatures in nature, modeling systems that resemble these behaviors are constructed. Artificial intelligence is usually directed at analyzing humans' thinking methods and developing artificial instructions like them. In general, artificial intelligence enables behaviors that are identified as intelligent when conducted by humans, intelligent behavior, to be performed by machines, or artificial intelligence is a theory showing how the human mind works. The goal of the artificial intelligence is to make the machines more intelligent and useful. Artificial intelligence provides the machines with several functions such as thinking, decision making, comparison and analysis like the ones displayed by humans. Artificial intelligence has many applications such as application specific systems, fuzzy logic, artificial neural networks, and genetic algorithms. Artificial neural networks (ANN) are algorithm developed to mimic the operational mechanism of the human brain, the basic functions of the brain such as learning, memory and deriving new information by generalization. ANNs are synthetic structures that mimic the biological neural networks. The mimicked nerve cells contain neurons, and these neurons connect to each other in various ways to form a network. These networks are capable of learning, storing in memory and revealing the relationship between data. Artificial neural networks are inspired by biological neurons (nerve cells), resulting in artificial simulation of the brain's working mechanism.

Similar to the biological neurons, bind together in human brain, artificial neural networks are developed from a simple and generally adaptive units (artificial neurons) that mimic the input, compute and output characteristic of the biological neuron.

In the current art, artificial neural networks can be evaluated in 3 main categories. The first one is software, the second is semiconductor device based and the last one is superconductor device based. Significant progress has been made in software and semiconductor based artificial neural networks of the first and second categories, particularly in the stages of developing algorithms. But the most important problem of these systems is their slow operation and high-power consumption. Neuron circuits can be designed on software, but since too many algorithms work, the processes are carried out slowly. The problems with superconductor-based artificial nerve cells are that the circuits do not operate reliably, the single flux quantum (SFQ) is not compatible with the digital circuits, and that they are relatively complex structures having large areas. In the electronic application of artificial neural networks, there are integrated structures on the chip and these structures occupy a large area.

Current soma circuits have only positive (+) inputs. Therefore, in order for the weighting information from the synapses to be positively (+) and negatively (-) weighted, another circuit must be connected before connecting to a neuron. This both increases the size of the circuit and increases the cost.

OBJECTS OF THE INVENTION

The object of the present invention relates to a SOMA circuit that collects current pulses from two different inputs in a time domain and transmits a current pulse to the output as the number of current pulses exceeds a threshold value. This process is done within a constant time in the orders of picoseconds.

This time is determined by the resistor and inductances in the circuit (R/L).

The two most important advantages of the invention over software and semiconductor-based designs are much higher processing speed and much lower power consumption. Its advantage over existing superconductor designs is its reliable and repeatable operating range, smaller and simpler circuit structure. In addition, its compatibility with existing digital design libraries will facilitate the development of complex artificial neural networks.

The advantage of this invention over SOMA circuits in current applications is that positive (+) and negative (-) synapse weights can be directly connected to the invented soma circuit. Thus, the power consumption is reduced, and both integration and performance are increased.

BRIEF DESCRIPTION OF THE INVENTION

The present invention is suitable for use in artificial neural networks and artificial intelligence applications that require high speed, for example in autonomous land, air and sea vehicles containing artificial neural networks.

In its most basic form, the soma circuit defined in the first claim and other claims dependent on this claim, realized in order to achieve the purpose of this invention, comprises: a positive input; a negative input; a first inductor and a first escape junction on a first branch connected to a positive input; a SQUID ring comprising a first junction, a second junction, a second inductor, and a first resistor, and connected to the first branch through the line between the first junction and the second junction; a fourth inductor and a second escape junction on a second branch connected to a negative input; a second SQUID ring comprising a third junction, a fourth junction, a fifth inductor, and a third resistor, and attached to the second branch from the line between the third junction and the fourth junction; a first bias resistor connected to a first DC voltage source; a second bias resistor with one end connected between the second junction and the second inductor; a third bias resistor with one end connected between the fourth junction and the fifth inductor; a third inductor matched with the second inductor and a second resistor connected to this third inductor; a sixth inductor matched with a fifth inductor and a fourth resistor connected to that sixth inductor; a seventh inductor connected to the line between the third inductor and the sixth inductor; a second DC voltage source and a fourth bias resistor on a third branch connected to one end of the seventh inductor; an output junction located on a fourth branch connected to one end of the seventh inductor; an eighth inductor and an output connected to one end of the seventh inductor.

When a current pulse comes from the positive input of the SOMA circuit of the invention, this current pulse enters the first SQUID ring after passing through the first inductor and the first escape junction, respectively. Here, a part of the said current pulse flows to the ground over the first junction, and another part proceeds over the second junction and comes to the second inductor. Due to the current pulse passing through the second inductor, a current is induced on the third inductor and part of this induced current passes through the seventh inductor and reaches the output junction. When a current pulse comes from the negative input, this current pulse reaches the second SQUID ring after passing through the fourth inductor and the second escape junction, respectively. Here, a part of the said current pulse flows to the ground via the third junction, while the other part proceeds over the fourth junction and arrives at the fifth inductor. When current flows through the fifth inductor, a current is induced on the sixth inductor.

The residence times of the current pulses in the first SQUID ring are determined by the first resistor and the second inductor, while the residence times in the second SQUID ring are determined by the third resistor and the fifth inductor.

The current pulse from the positive input increases the value of the current pulse on the seventh inductor, while the current pulse from the negative input decreases the current pulse on the seventh inductor.

In other words, the difference between the current pulses from the positive input and the negative input is taken.

The time it takes for currents from the positive input and the negative input to pass through the seventh inductor is determined by the second resistor and the fourth resistor. If this net current value passing through the seventh inductor and arriving at the output junction exceeds the threshold value of the output junction, a one-unit pulse of current flows from the output. Here the threshold value of the output junction is determined by the second DC voltage source and the fourth bias resistor.

DETAILED DESCRIPTION OF THE INVENTION

The SOMA circuit developed to fulfill the objects of the present invention is illustrated in the accompanying figures, in which:

FIG. 1. is a view of the SOMA circuit according to the invention.

The components given in the figures are enumerated individually, and the meanings of these numbers are given below.

100. SOMA circuit
110 Positive input
111 First inductor
112 First escape junction
113 First SQUID ring
114 First junction
115 Second junction
116 Second inductor
117 First resistor
118 Third inductor
119 Second resistor
120 Negative input
121 Fourth inductor
122 Second escape junction
123 Second SQUID ring
124 Third junction
125 Fourth junction
126 Fifth inductor
127 Third resistor
128 Sixth inductor
129 Fourth resistor
130 First DC voltage source
131 First bias resistor
132 Second bias resistor
133 Third bias resistor
140 Seventh inductor (140)
150 Second DC voltage source
151 Fourth bias resistor
160 Output junction
170 Eighth Inductor
180 Output
T Earth
K1 First branch
K2 Second branch
K3 Third branch
K4 Fourth branch
K5 Fifth branch
k Positive coupling coefficient
−k Negative coupling coefficient The SOMA circuit (100), which is the subject of the invention, in its most basic form, comprises:

a first inductor (111) and a first escape junction (112) on a first branch (K1) connected to a positive input (110), a SQUID ring (113) comprising a first junction (114), a second junction (115), a second inductor (116), and a first resistor (117), and connected to the first branch (K1) through the line between the first junction (114) and the second junction (115), a fourth inductor (121) and a second escape junction (122) on a second branch (K2) connected to a negative input (120), a second SQUID ring (123) comprising a third junction (124), a fourth junction (125), a fifth inductor (126), and a third resistor (127), and attached to the second branch (K2) from the line between the third junction (124) and the fourth junction (125), a first bias resistor (131) connected to a first DC voltage source (130), a second bias resistor (132) with one end connected between the second junction (115) and the second inductor (116), a third bias resistor (133) with one end connected between the fourth junction (125) and the fifth inductor (126), a third inductor (118) matched with the second inductor (116) and a second resistor (119) connected between this third inductor (118) and ground (T), a sixth inductor (128) matched with a fifth inductor (126) and a fourth resistor (129) connected between that sixth inductor (128) and ground (T), a seventh inductor (140) connected to the line between the third inductor (118) and the sixth inductor (128), a second DC voltage source (150) and a fourth bias resistor (151) on a third branch (K3) connected to one end of the seventh inductor (140), an output junction (160) located on a fourth branch (K4) connected to one end of the seventh inductor (140), an eighth inductor (170) and an output (180) connected to one end of the seventh inductor (140).

The SOMA circuit (100) shown in FIG. 1 comprises two inputs for input of current pulses. One of these inputs is the positive input (110) and the other is the negative input (120). The current values from the positive input (110) and negative input (120) in the SOMA circuit (100) are positive value current pulses.

The reason for the right side of the soma circuit (100) being called the negative input (120) is because the current pulse from the negative input (120) reduces the current pulse on the seventh inductor (140), which will be discussed later.

As shown in FIG. 1, there is a first inductor (111) and a first escape junction (112) on a first branch (K1) connected to the positive input (110), respectively. A first SQUID ring (113) is attached to the other end of the first escape junction (112) that is not connected to the first inductor (111). This first SQUID ring (113), which has two junctions here, is a DC SQUID ring. Said first SQUID ring (113) is a first junction (114) connected to a ground (T), a second junction (115) connected to the first junction (114), a second inductor (116) connected to the second junction (115), a first resistor (117) connected to the second inductor (116) and a ground (T) connected to the first resistor (117). Said first junction (114) and second junction (115) are preferably a Josephson junction. Here, the line between the first junction (114) and the second junction (115) is connected to the said first branch (K1) on which the first escape junction (112) is located.

The first junction (114) and the second junction (115) in the first SQUID ring (113) adjust the input pulses. In other words, thanks to the first junction (114) and the second junction (115), current pulses of more than one unit are prevented, while allowing only one-unit pulses to pass. For example, when two- or more-unit current pulses come, the passage of these current pulses is prevented, and instead it is ensured that the said current pulses come as a unit. The first escape junction (112), on the other hand, prevents the current pulses flowing through this first escape junction (112) from returning to the positive input (110).

The circuits connected to the positive input (110) and negative input (120) of the SOMA circuit (100) are symmetrical. The negative input (120) of the SOMA circuit (100) is connected to a second branch (K2), on this second branch (K2) a fourth inductor (121) and a second escape junction (122) are located, respectively.

A second SQUID ring (123) is attached to the other end of the second escape junction (122) that is not connected to the fourth inductor (121). This second SQUID ring (123), which is has two junctions here, is also a DC SQUID ring. Said second SQUID ring (123) comprises a third junction (124) connected to a ground (T), a fourth junction (125) connected to the third junction (124), a fifth inductor (126) connected to the fourth junction (125), a third resistor (127) connected to the fifth inductor (126) and a ground (T) connected to the third resistor (127). Here, the line between the third junction (124) and the fourth junction (125) is connected to the said second branch (K2) on which the second escape junction (122) is located.

The third junction (124) and the fourth junction (125) located in the second SQUID ring (123) adjust the input pulses. In other words, thanks to the third junction (124) and the fourth junction (125), current pulses of more than one unit are prevented, while allowing only one-unit pulses to pass. For example, when two or more unit current pulses come, the passage of these current pulses is prevented, and instead it is ensured that the said current pulses come as a unit. The second escape junction (122), on the other hand, prevents the current pulses flowing through this second escape junction (122) from returning to the negative input (120) again.

The first inductor (111) connected to the positive input (110) and the fourth inductor (121) connected to the negative input (120) correct the mismatch between the first SQUID ring (113) and the second SQUID ring (123). In other words, these inductors act as impedance matching.

At the top of the SOMA circuit (100), there is provided a first DC voltage source (130). The first DC voltage source (130) is connected to a first bias resistor (131). The first bias resistor (131) is used to control the current of the SOMA circuit (100). In the SOMA circuit (100), moreover, a second bias resistor (132) with one end connected between the second junction (115) and the second inductor (116), a third bias resistor (133) with one end connected between the fourth junction (125) and the fifth inductor (126), is connected.

Here, the first bias resistor (131) is connected between the other ends of the second bias resistor (132) and the third bias resistor (133).

Said second inductor (116) is matched with a third inductor (118). Here, when a current pulse passes through the second inductor (116), a current is induced on the third inductor (118) corresponding to the second inductor (116). The induced current flows towards the right side of the circuit. Said third inductor (118) is connected to the second resistor (119) from a first end, and the second resistor (119) is connected to ground (T).

Said fifth inductor (126) is matched with a sixth inductor (128). Here, when a current pulse passes through the fifth inductor (126), a current is induced on the sixth inductor (128) corresponding to the fifth inductor (126). The induced current again flows towards the right side of the circuit. Said sixth inductor (128) is connected to the fourth resistor (129) at a first end and the fourth resistor (129) is connected to ground (T).

Current pulses from the positive input (110) and negative input (120) can only stay in the first SQUID ring (113) and the second SQUID ring (123) for a certain period of time in the order of picoseconds. This part is similar to the forgetting feature in biological neurons after a certain period of time. The residence times of the current pulse in the first SQUID ring (113) and the second SQUID ring (123) in the said time domain are determined by the resistors and inductors in these rings (R/L). The residence time in the first SQUID ring (113) is determined by the first resistor (117) and the second inductor (116), and the residence time in the second SQUID ring (123) is determined by the third resistor (127) and the fifth inductor (126).

On the line between the third inductor (118) and the sixth inductor (128), a seventh inductor (140) is connected at one end. Here, the sum of the currents flowing through the third inductor (118) and the sixth inductor (128) passes through the seventh inductor (140).

The current value on the seventh inductor (140) attenuate over time. Here, the time it takes for the currents from the positive input (110) and the negative input (120) to pass through the seventh inductor (140) depends on the value of the second resistor (119) and the fourth resistor (129).

A third branch (K3), a fourth branch (K4) and a fifth branch (K5) are connected to the other end of the seventh inductor (140).

A second DC voltage source (150) and a fourth bias resistor (151) are located on the third branch (K3). Here, the fourth bias resistor (151) regulates the current flowing from the second DC voltage source (150).

There is an output junction (160) on the fourth branch (K4) and a ground (T) connected to this output junction (160). The difference of the currents induced on the third inductor (118) and the sixth inductor (128) flows over the output junction (160) after passing through the seventh inductor (140).

On the fifth branch (K5), there is provided an eighth inductor (170) and output (180). The eighth inductor (170) connected to the output (180) acts as an impedance matching.

If the current pulse on the output junction (160) is above a threshold value, it transmits a current pulse to the output (180). The threshold value of the output junction (170) is determined by the second DC voltage source (150) and the fourth bias resistor (151) (V/R), where the higher the value of the fourth bias resistor (151), the lower the threshold value of the output junction (160). For example, when a three unit current pulse comes from the positive input (110) and a two unit current pulse comes from the negative input (120), the net current on the output junction (160) is one unit current pulse value. If the threshold value is one unit current pulse, then a unit current pulse output is realized from the output (180). In other words, regardless of the total weight (current pulse) on the output junction (160), if it exceeds the threshold value of the output junction (160), a single current pulse is output. Therefore, the information that whether the total weight received is only above the threshold value of the output junction (160) or not is received from the output (180).

This single-junction line among the ground (T) connected to the fourth branch, the output junction (160) connected to this ground (T), the seventh inductor (140), the sixth inductor (128), the fourth resistor (129) and the ground (T) connected to this fourth resistor (129) forms an RF SQUD ring. Said RF SQUID ring transmits a single current pulse to the output (180), and not multiple current pulses at the same time. Thus, since more than one current pulse is not generated at the output (180), there is no need to use an additional circuit to reduce multiple current pulses to a single current pulse.

The working principle of the invention is as follows; when a current pulse comes from the positive input (110), this current pulse enters the first SQUID ring (113) after passing through the first inductor (111) and the first escape junction (112), respectively. Here, a part of the said current pulse flows to the ground (T) over the first junction (114), while another part proceeds over the second junction (115) and arrives at the second inductor (116). Due to the current pulse flowing through the second inductor (116), a current pulse is induced on the third inductor (118). A portion of the current pulse induced on the third inductor (118) passes over the seventh inductor (140) and reaches the output junction (160).

When a current pulse comes from the negative input (120), this current pulse reaches the second SQUID ring (123) after passing through the fourth inductor (121) and the second escape junction (122), respectively. Here, a part of the said current pulse flows to the ground (T) over the third junction (124), while another part proceeds over the fourth junction (125) and arrives at the fifth inductor (126). When a current pulse passes through the fifth inductor (126), a current pulse is induced on the sixth inductor (128). The current pulse from the negative input (120) tends to reduce the current pulse from the positive input (110).

In other words, the current pulse from the positive input (110) increases the current pulse on the seventh inductor (140), while the current pulse from the negative input (120) decreases the current pulse on the seventh inductor (140). Therefore, the difference between the current pulses coming from the positive input (110) and the negative input (120) is taken here. If this net current value exceeds the threshold value of the output junction (160), a current pulse of one unit is received from the output (160).

The invention claimed is:

1. A SOMA circuit comprising:
 a first inductor and a first escape junction on a first branch connected to a positive input;
 a SQUID ring comprising a first junction, a second junction, a second inductor, and a first resistor, and connected to the first branch through a line between the first junction and the second junction;
 a fourth inductor and a second escape junction on a second branch connected to a negative input;
 a second SQUID ring comprising a third junction, a fourth junction, a fifth inductor, and a third resistor, and attached to the second branch from a line between the third junction and the fourth junction;
 a first bias resistor connected to a first DC voltage source, a second bias resistor with one end connected between the second junction and the second inductor;
 a third bias resistor with one end connected between the fourth junction and the fifth inductor;
 a third inductor matched with the second inductor and a second resistor connected to the third inductor;
 a sixth inductor matched with a fifth inductor and a fourth resistor connected to the sixth inductor;
 a seventh inductor connected to a line between the third inductor and the sixth inductor;
 a second DC voltage source and a fourth bias resistor on a third branch connected to one end of the seventh inductor;
 an output junction located on a fourth branch connected to one end of the seventh inductor; and
 an eighth inductor connected to one end of the seventh inductor and an output.

2. The SOMA circuit according to claim 1, wherein the first SQUID ring and the second SQUID ring, each comprise a DC SQUID ring.

3. The SOMA circuit according to claim 1, wherein the first junction, second junction, third junction and fourth junction allow adjustment of the input pulses.

4. The SOMA circuit according to claim 1, wherein the first escape junction and a second escape junction prevent the return of current pulses flowing therethrough.

5. The SOMA circuit according to claim 1, wherein the first inductor and the fourth inductor allow impedance matching between the first SQUID ring and the second SQUID ring.

6. The SOMA circuit according to claim 1, wherein the first bias resistor is connected to the second bias resistor and the third bias resistor, allowing the current of the soma circuit to be controlled.

7. The SOMA circuit according to claim 1, wherein the first resistor, second inductor, third resistor, and fifth inductor determine he residence times of the current pulse in the first SQUID ring and the second SQUID ring.

8. The SOMA circuit according to claim 1, wherein the second resistor and fourth resistor determine the time it takes for currents from the positive input and the negative input to pass through the seventh inductor.

9. The SOMA circuit according to claim 1, wherein the fourth bias resistor regulates the current flowing from the second DC voltage source.

10. The SOMA circuit according to claim 1, wherein the eighth inductor is provided for impedance matching.

11. The SOMA circuit according to claim 1, wherein the output junction sends a current pulse to the output when the current flowing therethrough exceeds a threshold value.

12. The SOMA circuit according to claim 11, wherein the second DC voltage source and fourth bias resistor determine the threshold value of the output junction.

13. The SOMA circuit according to claim 1, comprising an RF SQUD ring comprising a ground connected to the fourth branch, wherein the output junction is connected to this ground, the seventh inductor, sixth inductor, fourth resistor and a ground connected to this fourth resistor.

\* \* \* \* \*